United States Patent [19]
Patel et al.

[11] Patent Number: 5,438,580
[45] Date of Patent: Aug. 1, 1995

[54] LASER PACKAGE AND METHOD OF ASSEMBLY

[75] Inventors: Rushikesh M. Patel, Pomona; Michael M. Ung, Ontario, both of Calif.

[73] Assignee: Opto Power Corporation, City of Industry, Calif.

[21] Appl. No.: 126,259

[22] Filed: Sep. 24, 1993

[51] Int. Cl.⁶ .............................................. H01S 3/04
[52] U.S. Cl. ......................................... 372/36; 372/75
[58] Field of Search ....................... 372/36, 75, 43, 50

[56] References Cited

U.S. PATENT DOCUMENTS

| | | | |
|---|---|---|---|
| 3,303,432 | 2/1967 | Garfinkel et al. | 372/36 |
| 3,351,698 | 11/1967 | Marinace | 372/36 |
| 3,962,655 | 6/1976 | Selway et al. | 372/36 |
| 4,411,057 | 10/1983 | Duda et al. | 372/36 |
| 4,546,478 | 10/1985 | Shimizu et al. | 372/36 |
| 5,181,216 | 1/1993 | Ackerman et al. | 372/36 |

FOREIGN PATENT DOCUMENTS

| | | | |
|---|---|---|---|
| 0151484 | 8/1984 | Japan | 372/36 |
| 0074784 | 3/1989 | Japan | 372/36 |
| 4097581 | 3/1992 | Japan | 372/36 |

*Primary Examiner*—James W. Davie
*Attorney, Agent, or Firm*—Herbert M. Shapiro

[57] ABSTRACT

A laser package is designed for large scale assembly by machining a piece part of relatively large dimensions where the part has a slot for holding a laser. The piece part is mounted on heatsink of like dimensions. A second piece part includes an elongated groove for holding a fiber lens plate where the second piece part is mounted against the edge of the heat sink such that the lens is properly aligned with the laser. Thus, the critical alignment of the laser and the fiber is achieved by the alignment of like dimensioned piece parts of relatively large dimensions.

11 Claims, 4 Drawing Sheets

LASER PACKAGE AND METHOD OF ASSEMBLY

FIELD OF THE INVENTION

This invention relates to laser devices and more particularly to the packaging of laser chips for large scale production thereof.

BACKGROUND OF THE INVENTION

Laser devices are well known in the art. Such devices typically are made one at a time. Particularly single mode lasers require expensive, vibration free platforms, optical benches, and highly accurate positioning equipment. The requirements for multi mode lasers are relatively relaxed yet still taxing. Thus, the cost for lasers is still relatively high.

BRIEF DESCRIPTION OF THE INVENTION

The present invention is directed at a packaging arrangement for lasers which permits large scale production of the devices. The package comprises an assemblage of piece parts of relatively large dimensions compared to the dimensions of a laser chip. The piece parts are assembled in a jig where gravity urges the parts against a planar bearing surface. A laser chip is placed in a slot in a planar, relatively large piece part and a fiber lens is positioned in a second relatively large piece part. Placement of the piece parts in the jig permits the positioning of the laser emitting surface accurately with respect to the fiber lens without careful alignment of the laser emitting face and the lens. The manufacturing of the laser package thus entails only the assembly of relatively large piece parts which can be handled on a production basis rather than requiring careful alignment of critical elements of the package. The design of the package and the assemblage of relatively large piece parts also permits the manufacture of a plurality of laser packages simultaneously thus permitting large scale, automatic manufacture and thus lower cost.

DETAILED DESCRIPTION OF AN ILLUSTRATIVE EMBODIMENT OF THIS INVENTION

Figure 1:
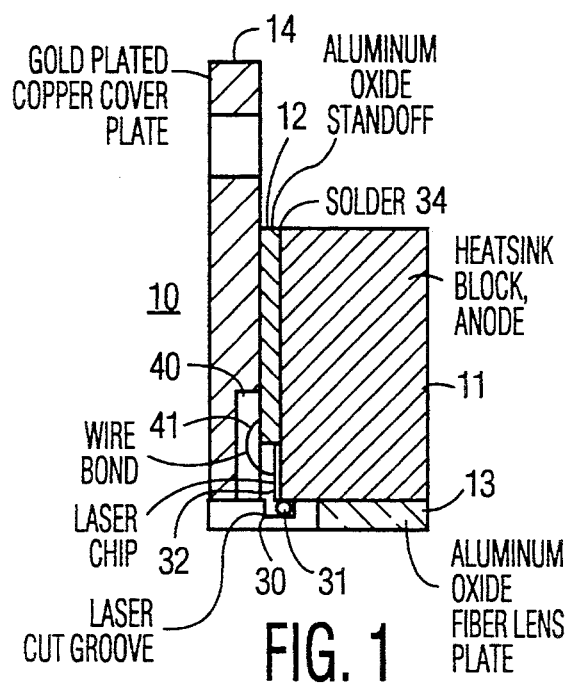
FIG. 1 is cross sectional view of a laser package in accordance with the principles of this invention.

FIG. 1 shows a cross sectional view of a laser package 10 in accordance with the principles of this invention. The package comprises an assemblage of piece parts including a heat sink 11, and aluminum oxide stand off 12, an aluminum oxide, fiber lens plate 13, and a gold plated copper cover plate 14.

Figure 2:
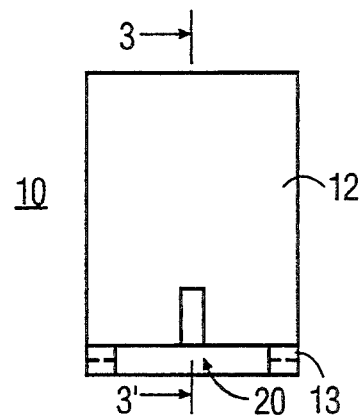
FIG. 2 is a top view of a portion of the package of FIG. 1.

FIG. 2 shows a top view of package 10 without cover plate 14 in place thus exposing stand off 12. The stand off can be seen to include a slot 20 which is rectangular in shape in the embodiment shown as viewed in FIG. 2. Slot 20 is provided to hold a laser as will become clear hereinafter.

Figure 3:
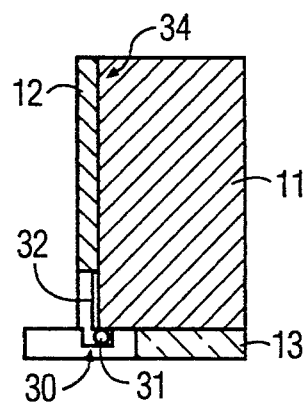
FIG. 3 is a cross sectional view of the portion of the package shown in FIG. 2.

FIG. 3 shows a cross sectional view of the package of FIG. 2 taken along line 3-3' through slot 20. FIG. 3 also shows a groove in fiber lens plate 13 into which a fiber lens 31 is placed. FIG. 3 also shows a laser chip 32 in position in slot 20 of FIG. 2. Laser chip 32 is held in position by solder layer 34 shown also in FIG. 1. The position of the groove (30) as well as the dimensions of the groove are designed, with respect to the fiber lens diameter, to position the fiber lens so that a laser positioned in slot 20 directs it's radiation output at the center of the fiber and the fiber is positioned at the focal plane of the radiant image.

FIG. 1 shows cover plate 14 having a stepped cross section to leave a pocket 40 at the end thereof which abuts fiber lens plate 13. Pocket 40 provides space for wire bond 41 which connects laser chip 32 to an electrically conducting surface layer on electrically insulating, aluminum oxide stand off 12 as shown.

Figure 4:
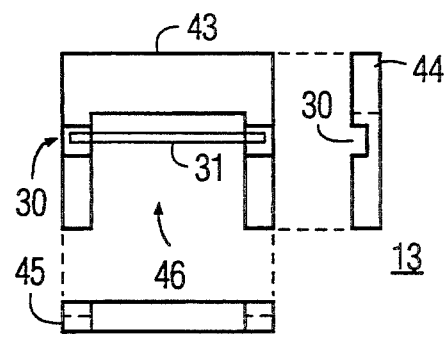
FIG. 4 is a composite top, side and front view of a portion of the package of FIG. 1.

FIG. 4 shows top, side, and front views 43, 44, and 45. The lens plate can be seen to have a U-shape geometry with groove 30 adapted to hold the fiber lens (31) over opening 46.

Figure 5:
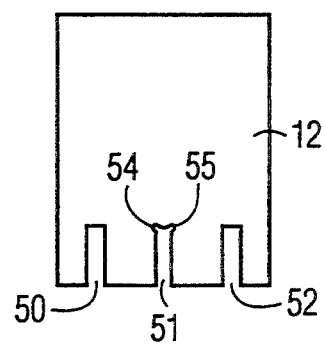
FIGS. 5 and 6 are top views of alternative piece parts for the package of FIG. 1.

FIG. 5 shows a top view of stand off 12 of FIG. 1. The stand off, in this embodiment, includes three slots 50, 51, and 52. Slot 51 can be seen to include extra cuts, 54 and 55, to permit complete insertion of the laser chip without the possibility of rounded cuts which would prevent proper seating of the laser chip in the slot. Slot 50 and 52 are used to prevent flow of epoxy toward laser diode facet if it were used to bond lens plate to heatsink. The slot is dimensioned to accept a chip so that the emission edge of the chip corresponds to the edge of the heatsink 11.

Figure 6:
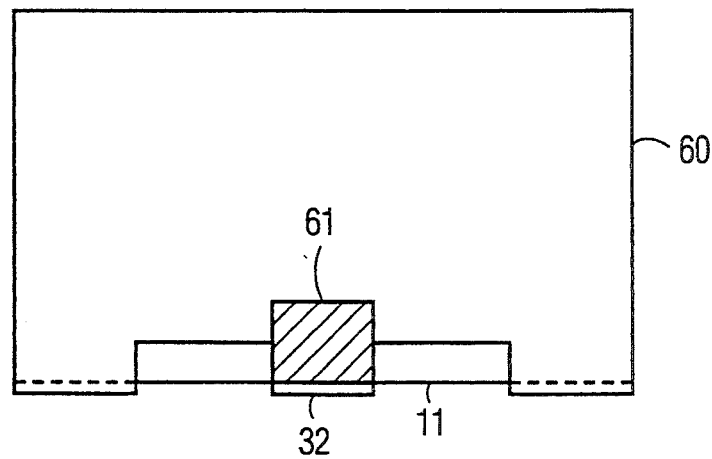

FIG. 6 shows an alternative stand off 60 where the slot 61 for the laser chip has a stepped geometry dimensioned to hold a chip closely over only part of it's length. Otherwise, the stand off of FIGS. 5 and 6 are quite similar as can be seen in the figures. The dimensions of the stand off are shown as one quarter of any inch by 0.155 inch with a slot 0.038 inch deep by 0.036 in wide. The dimensions of the heat sink correspond as indicated at 11 in FIG. 1. The stand off dimensions are such in the preferred embodiment, that the stand off protrudes into groove 30 of FIG. 1 to hold fiber lens 31 in place by the appropriate focal distance of the lens used. The stand off, as shown in FIGS. 5 or 6 comprise gold metalized ninety six per cent aluminum oxide 0.015 thick.

Figure 7:
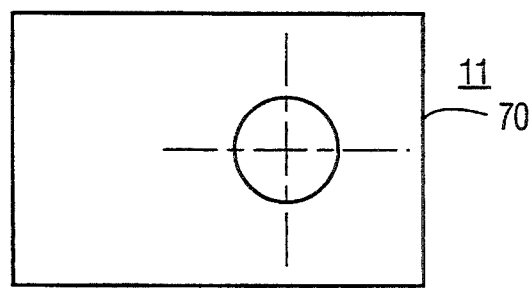
FIGS. 7 and 8 are top and side views of another piece part of the package of FIG. 1.
Figure 8:
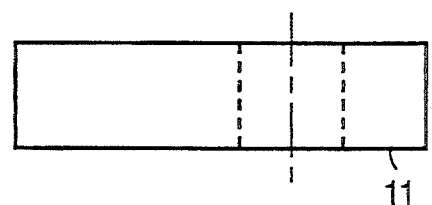

FIGS. 7 and 8 show top and side views of heatsink block 11 of FIG. 1. The heatsink can be seen to have dimensions of 0.375 by 0.250 and a thickness of 0.060 inch. The heatsink has a through hole 0.096 inch in diameter with a center 0.125 inch from edge 70. The heatsink comprises ninety per cent tungsten and ten per cent copper alloy thermally matched to gallium arsenide or equivalent. The heatsink is plated with one hundred and twenty millionths of an inch of gold over sixty millionths of nickel. The top and bottom surfaces have finishes of forty millionths or better.

Cover plate 14 has dimensions of 0.250 by 0.210 and a thickness of 0.06 inch. The step forming pocket 40 (FIG. 1) is 0.110 inch deep and 0.035 inch high. The cover plate comprises copper with a gold flash over seventy five millionths of nickel.

Lens plate 13 of FIG. 1 has dimensions of 0.25 by 0.100 inch with a thickness of 0.060 inch. The lens plate has a generally U-shaped geometry with a base 0.045 inch wide and legs 0.055 inch long by 0.05 inch wide. Groove 30 (FIG. 1) is 0.012 inch deep by 0.012 inch wide. The lens plate may conveniently have the thickness of the leg less the focal length of the lens and solder or epoxy thickness than the thickness of the base.

Figure 9:
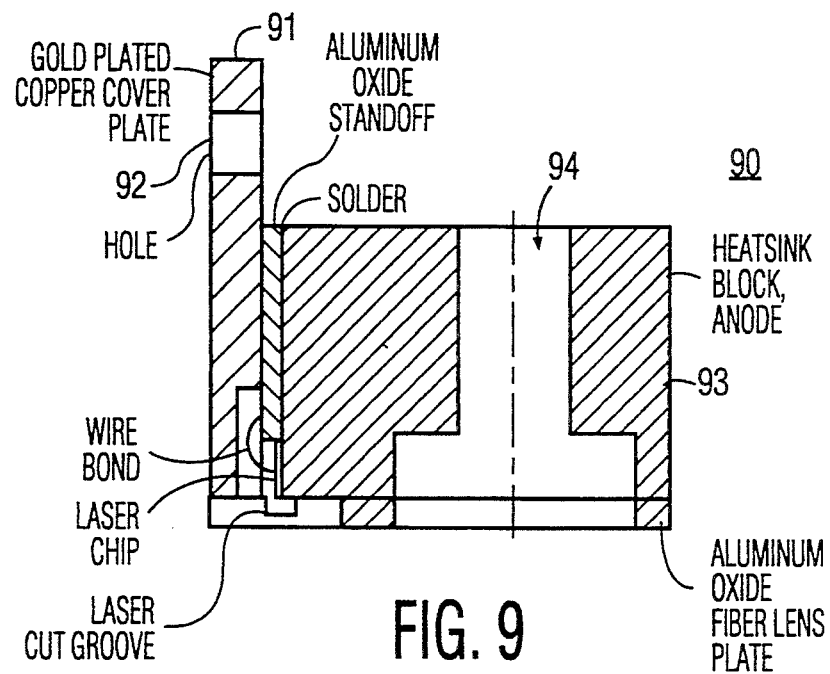
FIG. 9 is a cross sectional view of an alternative package in accordance with the principles of this invention; and FIG'S. 10 through 13 are various views of a production jig for the assemblage of the piece parts of laser packages in accordance with the principles of this invention.

FIG. 9 shows a cross sectional view of a practical one watt laser chip package 90. The figure shows cover plate 91 having a hole 92 for the cathode lead and also shows heatsink (anode) 93 having a hole 94 for a screw to secure the package to an assembly.

Figure 10:
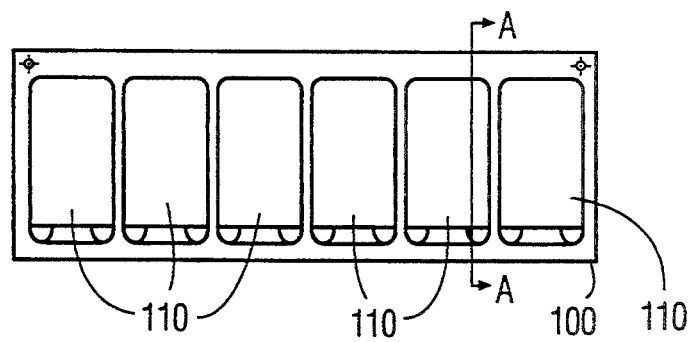
Figure 11:
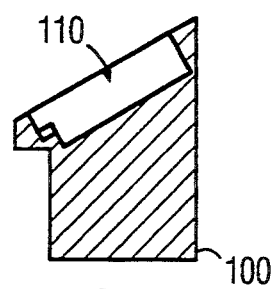
Figure 12:
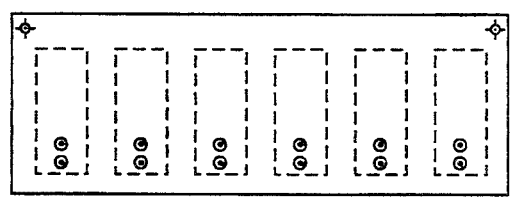
Figure 13:

FIGS. 10 and 11 show top and cross sectional views of a one watt laser bonding fixture or jig 100. The fixture comprises a graphite block 0.480 inch by 0.786 inch high at one vertical face and 0.350 inch at the other vertical face as shown in the figure thus providing a thirty degree slope to a recesses 110 for receiving the piece parts of a laser package in accordance with the principles of this invention. The various dimensions of the fixture are shown in the figure. The top face of the fixture as shown in FIG. 10 includes six recesses (110) one for each of six packages to be assembled simultaneously. The interior surfaces of the fixture are coated with glass to provide sufficiently smooth and flat surfaces.

The piece parts of six packages are positioned simultaneously in the recesses 110 oriented so that the upper ends of the piece parts, as viewed in FIG. 1, face to the left as viewed in FIG. 11.

First, the aluminum oxide stand off 12 is put in place along with the laser chip and soldered using 80% gold and 20% tin solder, illustratively to 320° C. for 30 seconds. The lead wire connecting the laser chip to the surface of the corresponding stand off is then wire bonded. Next the fiber lens plate is placed in the fixture and lens positioned in the plate. A 90% Tin and 10% Gold preform is placed on the lens plate and the heatsink put in so as to bond the two together. Next the cover plate is bonded using either 60% Tin and 40% Lead or 100% Indium.

The assembly fixture capitalizes on the package design to achieve a simple package assembly permissive of mass production by relaxing the constraints on the critical laser chip to fiber lens placement using relatively large piece parts to hold the critical components and by assembling those piece parts in a manner to ensure the proper alignment of the critical components.

it is to be understood that the embodiments described herein are only illustrative and modifications of the various dimensions and materials can be made still within the spirit and scope of the invention. What is important is that the critical components of a laser package, the laser chip and the fiber lens, are constrained by piece parts which are relatively large and permissive of easy handling and assembly yet in a manner to ensure alignment of those critical components.

What is claimed is:

1. A laser package, said package including a planar, electrically insulating member and a laser chip having an emitting face, said member having a slot extending therein from said first edge, said chip being positioned within said slot, said member having first and second large area faces with dimensions large compared to that of said chip, said first face having an electrically conducting surface layer thereon, said member having a thickness greater than that of said chip.

2. A laser package as set forth in claim 1 also including a heat sink bonded to said first surface of said member and having dimensions corresponding to those of said member.

3. A laser package as set forth in claim 2 also including a fiber lens plate, said plate including a groove, said plate being bonded to the edge of said heatsink and said member such that said groove is aligned with said emitting face of said laser chip, said plate having a width to correspond to that of said heatsink and said member, said package including a fiber lens in said groove.

4. A laser package as set forth in claim 3 also including a cover plate, said cover plate having a width to correspond to that of said heatsink, said member and said lens plate, said cover plate having a stepped geometry to form a pocket with said member when juxtaposed with said second surface thereof for a lead wire connecting said chip to said member.

5. A laser package as set forth in claim 3 wherein said member has a length greater than that of said heatsink to extend into said groove for securing said fiber lens in place in alignment with said emitting face thereof.

6. A laser package as set forth in claim 5 also including a cover plate, said cover plate having a width to correspond to that of said heatsink, said member and said lens plate, said cover plate having a stepped geometry to form a pocket with said member when juxtaposed with said second surface thereof for a lead wire connecting said chip to said member.

7. A laser package, said package comprising a heat sink having a planar surface with x and y dimensions large compared with those of a laser chip and first and second linear edges perpendicular to one another, said package also including a planar electrically insulating stand off member having a second surface for juxtaposition with said planar surface, said stand off member having an electrically conducting surface layer, said member having a slot therein for holding a laser chip, said slot extending inwardly from said first edge and exposing a portion of said planar surface, said package including a lens plate having a groove therein for receiving a fiber lens, said lens plate also having a linear edge, said linear edge being juxtaposed with said second edge such that said groove is positioned at the exposed portion of said first surface for alignment with a laser chip affixed to said exposed portion.

8. A laser package as set forth in claim 7 including a laser attached to said exposed portion and a lead wire connecting said laser to said stand off surface.

9. A laser package as set forth in claim 8 also including a planar cover plate having a surface and an edge said cover plate having a stepped profile to provide a cavity for said lead wire when the surface and the edge thereof are abutted against said stand off and said lens plate respectively.

10. A laser package as set forth in claim 9 wherein said slot in said stand off has a stepped geometry to closely correspond to the width of said laser only over a portion of the laser length.

11. A laser package as set forth in claim 9 wherein said groove in said lens plate is elongated to receive an optical fiber and said groove has an axis aligned parallel to the edge of said heatsink at said exposed portion.

* * * * *